United States Patent [19]

Suzuki

[11] Patent Number: 4,843,595
[45] Date of Patent: Jun. 27, 1989

[54] DATA READING CIRCUIT FOR SEMICONDUCTOR MEMORY DEVICE

[75] Inventor: Atsushi Suzuki, Kawasaki, Japan

[73] Assignee: Fujitsu Limited, Kanagawa, Japan

[21] Appl. No.: 4,950

[22] Filed: Jan. 20, 1987

[30] Foreign Application Priority Data

Jan. 20, 1986 [JP] Japan .................. 61-007953

[51] Int. Cl.⁴ .................. G11C 7/00; G11C 11/40
[52] U.S. Cl. .................. 365/189.01; 365/190; 365/207; 365/233.5; 307/530
[58] Field of Search ............. 365/189, 202, 205, 207, 365/208, 190; 307/530

[56] References Cited

U.S. PATENT DOCUMENTS

| | | | |
|---|---|---|---|
| 4,570,091 | 2/1986 | Yasuda | 307/530 X |
| 4,697,112 | 9/1987 | Ohtani et al. | 365/208 X |
| 4,713,797 | 12/1987 | Morton | 365/208 |
| 4,727,517 | 2/1988 | Veno | 365/208 |
| 4,742,488 | 5/1988 | Wong | 365/208 X |

FOREIGN PATENT DOCUMENTS

| | | |
|---|---|---|
| 0004444 | 10/1979 | European Pat. Off. . |
| 0037625 | 10/1981 | European Pat. Off. . |
| 0136229 | 4/1985 | European Pat. Off. . |
| 2129235 | 1/1973 | Fed. Rep. of Germany . |
| 3035484 | 4/1981 | Fed. Rep. of Germany . |
| 219615 | 3/1985 | German Democratic Rep. . |
| 5570989 | 5/1980 | Japan .................. 365/207 |

Primary Examiner—Stuart N. Hecker
Assistant Examiner—Alyssa H. Bowler
Attorney, Agent, or Firm—Armstrong, Nikaido, Marmelstein & Kubovcik

[57] ABSTRACT

A data reading circuit for a semiconductor memory device includes: a first input terminal and a second input terminal each receiving complementary signals. A first and a second current mirror type sense amplifiers, each including a reference node, an output terminal, a first transistor connected with the reference node, and a second transitor connected with the output terminal. A gate of the first transitor of the first current mirror type sense amplifier and a gate of the second transistor of the second current mirror type sense amplifier are connected to the first input terminal. A gate of the second transistor of the first current mirror type sense amplifier and a gate of the first transitor of the second current mirror type sense amplifier are connected to a second input terminal. The data reading circuit further includes a short-circuiting transistor connected between the reference nodes of both the first and the second current mirror type sense amplifiers. The first short-circuiting transistor is able to conduct therethrough temporarily by receiving a clock signal at a gate.

4 Claims, 13 Drawing Sheets

DATA READING CIRCUIT FOR SEMICONDUCTOR MEMORY DEVICE

BACKGROUND OF THE INVENTION

1. Field of the Invention

The present invention relates to a data reading circuit in a semiconductor memory device, and more particularly, to such a circuit adapted to realize an improved static random access memory which can operate at a speed of, for example, 25 ns to 35 ns.

2. Description of the Related Art

In general, in a data reading circuit of the prior art static random access memory (static RAM), when a signal from a data bus line is input, a sense amplifier senses the signal and delivers a sense output signal. The sense output signal is input to a first output transistor as a first sense data signal through a first set of inverters, and is input to a second output transistor as a second sense data signal through a second set of inverters. An output stage is composed of the above-noted first output transistor and second output transistor, which deliver the data output signals upon receipt of the first and second sense data signals.

In the above-mentioned data reading circuit, there is a first delay time from when an input signal is supplied to a sense amplifier to when a waveform of the sense output signal starts to lead or to trail, and a second delay time from when the above-mentioned sense output $S_{OT}$ is received to when the leading edge of the data signal starts to pass through a set of inverters. The sum of the first delay time and second delay time is regarded as the delay time for the operation.

In this case, if a gate input is given a time difference, to avoid making two of the series-connected output stage transistors simultaneously ON, the second delay time is inevitably long, and thus the problem of a reduced operational speed of the circuit arises.

In the prior art, two sense amplifiers are used and a complementary sense output is retrieved from among the sense outputs and input directly to the two series-connected output stage transistors through a set of inverters, thus obtaining the data output $D_{OT}$ from the output stage transistor. In the prior art data reading circuit having the above-described operation, the waveform of the complementary sense output signal is the same as in the case of one of the above-described sense amplifiers, and therefore, even in this case a problem arises in that the operation speed remains low.

SUMMARY OF THE INVENTION

The object of the invention is to provide an improved data reading circuit having an increased operation speed.

According to the present invention, there is provided a data reading circuit for a semiconductor memory device including: a first input terminal and a second input terminal for receiving each complementary signal; a first and a second current mirror type sense amplifiers, each of the current mirror type sense amplifiers including: a reference node; an output terminal; a first transistor connected with the reference node; and a second transistor connected with the output terminal, a gate of a first transistor of a first current mirror type sense amplifier and a gate of a second transistor of a second current mirror type sense amplifier being connected to a first input terminal and a gate of a second transistor of the first current mirror type sense amplifier and a gate of a first transistor of the second current mirror type sense amplifier being connected to a second input terminal; and a first short-circuiting transistor connected between the reference nodes of both the first and the second current mirror type sense amplifiers, the first short-circuiting transistor being able to conduct therethrough temporarily by receiving a clock signal at a gate.

DESCRIPTION OF THE PREFERRED EMBODIMENTS

Prior to the description of the preferred embodiments, a data reading circuit of a prior art static RAM will be described with reference to FIGS. 1 to 4.

Figure 1:
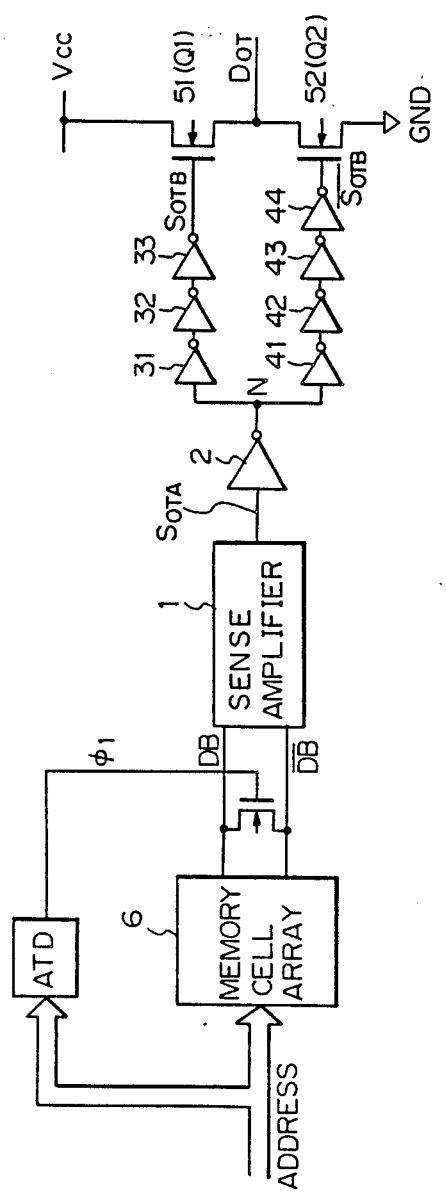
FIGS. 1 and 2 are a circuit diagram and a timing chart of a prior art data reading circuit, respectively.

FIG. 1 shows an example of a prior art data reading circuit. In FIG. 1, reference numeral 1 denotes a sense amplifier, 2 an inverter, 31, 32, 33 and 41, 42, 43, 44 inverters, 51(Q1) and 52(Q2) an output pull-up transistor (N channel MOS transistor) and an output pull-down transistor (N channel MOS transistor), respectively, DB and $\overline{DB}$ data bus lines, $S_{OTA}$ a sense output, $S_{OTB}$ and $S_{OTB}$ sense data input to the transistors 51(Q1) and 52(Q2) for the output pull-up, $D_{OT}$ data output, and N a node.

As shown in FIG. 1, a pair of data bus lines $\overline{DB}$ and DB are connected to a pair of bit lines through a column selection gate circuit and correspond to each stored memory data "1" and "0" read from a memory cell array 6; "1" representing a HIGH level, and "0" a "LOW" level.

When the signals from the data bus lines DB and $\overline{DB}$ are input, the sense amplifier 1 senses the signals and delivers the sense output $S_{OTA}$. The sense output $S_{OTA}$ is input, via a node N, to a transistor 51(Q1) through the inverters 31, 32 and 33 as sense data $S_{OTB}$, and at the same time, the sense output $S_{OTA}$ is inverted through the inverters 41, 42, 43, and 44 and input to a transistor 52(Q2) as sense data $S_{OTB}$.

The transistors 51(Q1) and 52(Q2) form an output stage and deliver the data output $D_{OT}$ upon receipt of the sense data $S_{OTB}$ and $S_{OTB}$, as described above.

It is particularly important in the circuit of FIG. 1 that the transistors Q1 and Q2 of the output stage should not be made "ON" simultaneously.

If such a state appears, a high rush current will flow because the mutual conductance $g_m$ of transistors Q1 and Q2 is high.

In this read data output circuit, a LOW level side of the sense data $S_{OTB}$, which is input to a gate of transistor Q1, must be reached quickly and a HIGH level side slowly, and a LOW level side of the sense data $S_{OTB}$, which is input to a gate of transistor Q2, must be reached quickly and a HIGH level side slowly.

Namely, the time interval from when a sense amplifier 1 receives inputs from the data bus lines DB and $\overline{DB}$ to when the sense data $S_{OTB}$ and $S_{OTB}$ is input to transistors Q1 and Q2 of the output stage must be given a time difference corresponding to the time needed for a transition from a LOW level to a HIGH level or a transition from a HIGH level to a LOW level.

Figure 2:
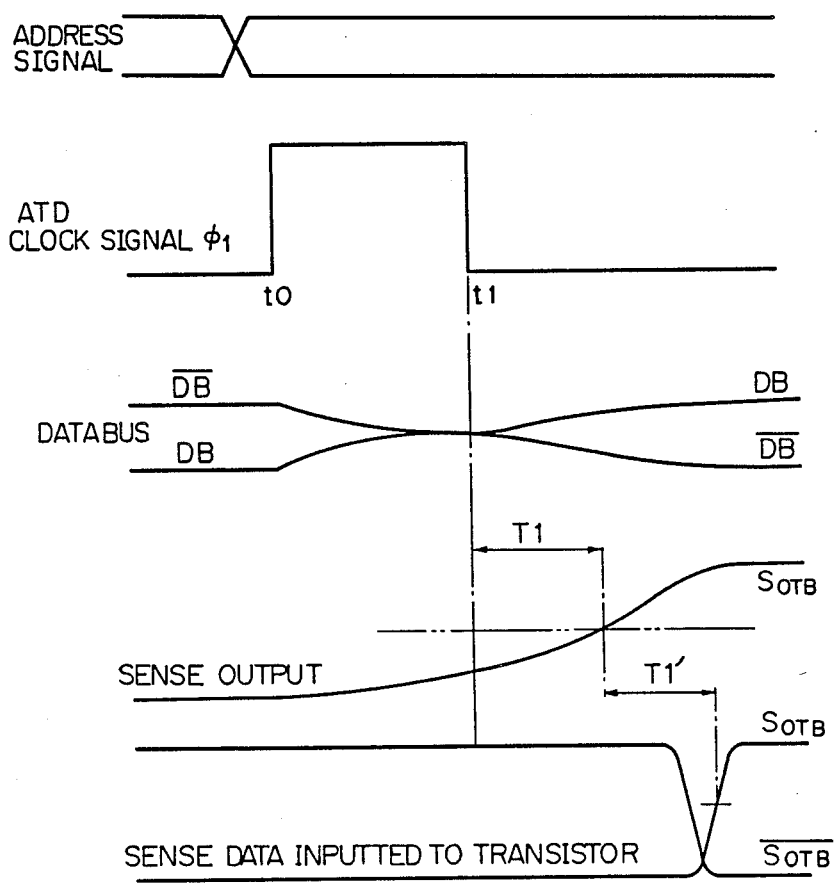

The relationship between distinct signals in the circuit of FIG. 1 is shown in FIG. 2.

In the circuit of FIG. 1, a short-circuit transistor is connected between data bus lines DB and $\overline{DB}$. In a normal operation, when an input address signal changes, an address transition detector (ATD) clock signal $\phi 1$ is generated by an address transition detector ATD to make the above-noted short-circuit transistor "ON". Thus, before data read from a memory cell array 6 appears on the data bus lines DB and $\overline{DB}$, the data bus lines DB and DB are once short-circuited to an intermediate level. Thereafter, data from the memory cell array 6 appearing at when an ATD clock signal $\phi 1$ trails, that is, when the aforementioned short-circuit transistor is "OFF", is input to the sense amplifier 1 as a signal from the data bus lines.

The time interval from when the read data is input to when the sense output $S_{OTA}$ starts to lead or to trail is referred to as a time interval T1, a time interval from when the sense output $S_{OTA}$ is received to when the sense data $S_{OTB}$ or $S_{OTB}$ starts to lead through inverters 2, 31, 32, 33, 41, 42, 43 and 44 is referred to as a time interval T1'. The sum of the time interval T1 and the time interval T1' is regarded as the delay time of the operation.

In the circuit of FIG. 1, if a time difference is given between the inputs to each gate of the transistors, to avoid making the transistors Q1 and Q2 at the output stage "ON" simultaneously, the time interval T1' becomes long, as a matter of course, and the operational speed of the circuit is reduced.

Figure 3:
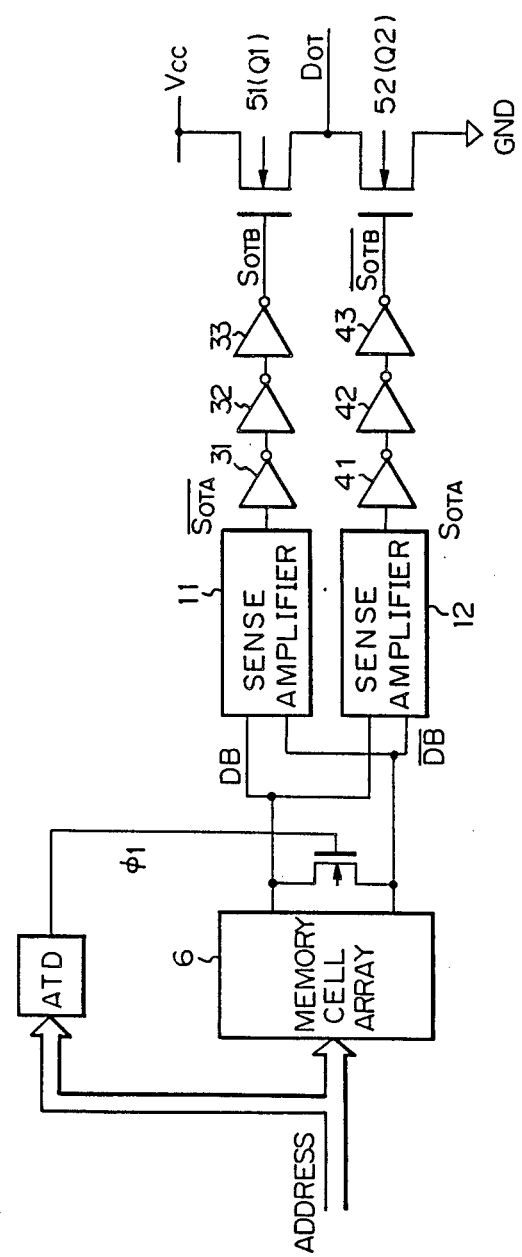
FIGS. 3 and 4 are a circuit diagram and a timing chart of another prior art data reading circuit, respectively.
Figure 4:
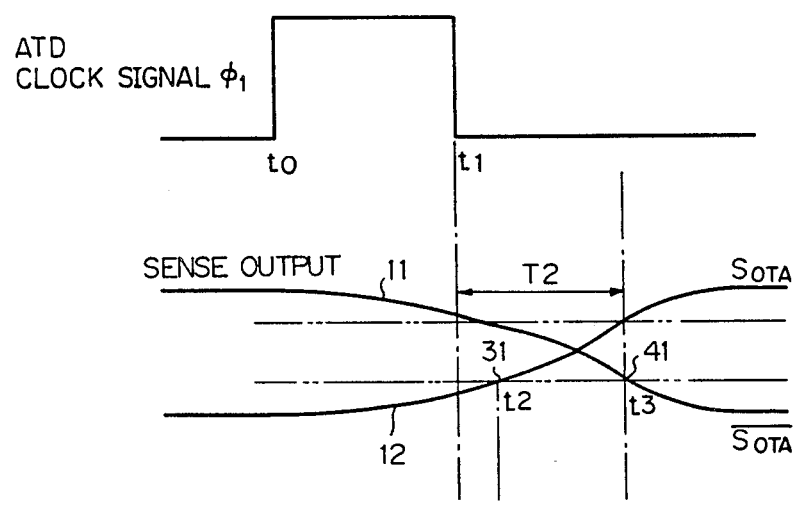

FIG. 3 is a circuit block diagram showing an alternative form of a prior art data reading circuit and FIG. 4 illustrates a timing chart of the signals in the circuit of FIG. 3. In FIG. 4 T2 denotes a delay time of the operation.

In the circuit of FIG. 3, two sense amplifiers 11 and 12 are used to output sense outputs. Among the sense outputs, a pair of complementary sense outputs $S_{OTA}$ and $S_{OTA}$ are retrieved and input directly to transistors 51(Q1) and 52(Q2) at an output stage through inverters 31, 32, and 33 or inverters 41, 42, and 43, and as a result, data outputs $D_{OT}$ are obtained from the transistors at an output stage.

In the circuit of FIG. 3, it is necessary to avoid competition between the transistors Q1 and Q2 at the output stage, i.e., Q1 and Q2 must not be made ON simultaneously.

Accordingly, the inverter to which the data delivered from the sense amplifiers 11 and 12 is input is utilized to regulate a threshold level, which is shifted from a "HIGH" level to a LOW level or from a LOW level to a HIGH level.

In case that the threshold level is set to a level lower than the level at which the sense outputs $S_{OTA}$ and $S_{OTA}$ intersect, in a state such that the sense outputs $S_{OTA}$ and $S_{OTA}$ of the sense amplifiers 11 and 12 are at a level higher than the aforementioned threshold level, both the gates of transistors Q1 and Q2 at the output stage are at a LOW level. Therefore, if a read operation is carried out therefrom, since both gates are at a LOW level, a shift can be carried out in such a manner that the side from which it is made necessary to read data is at a HIGH level.

In the circuit of FIG. 3, the waveforms of the sense outputs $S_{OTA}$ and $S_{OTA}$ are same as in the case of FIG. 1, where only a sense amplifier is operated, but the operational speed is still low.

A data reading circuit considered by the inventor to be an intermediate circuit in the attempt to solve the problems in the prior art shown in FIGS. 1 and 3, is shown in FIGS. 5 to 8.

Figure 5:
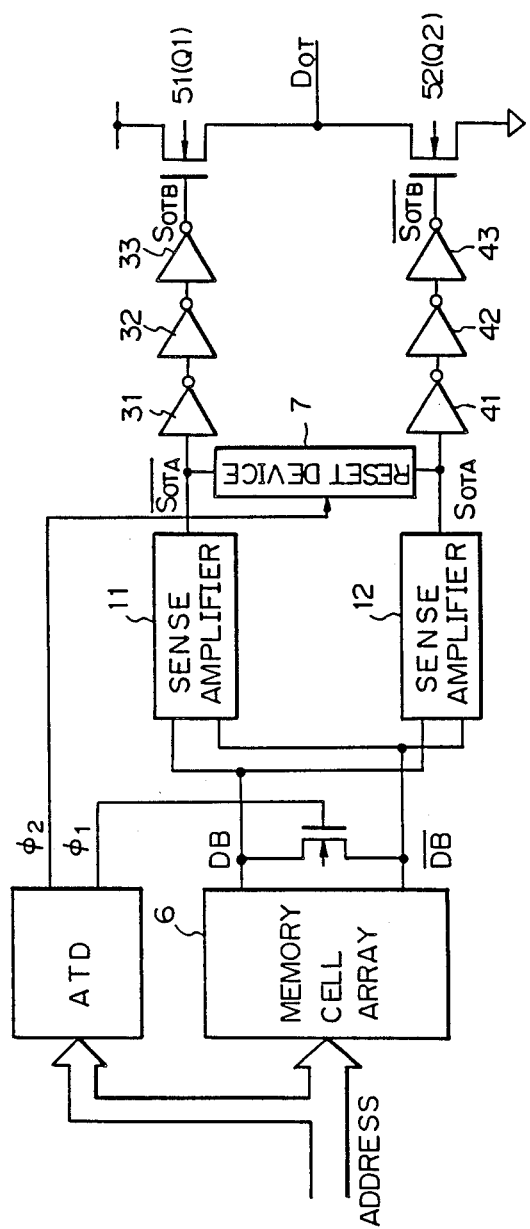
FIGS. 5 and 6 are circuit diagrams of a data reading device considered by the inventor to be an intermediate device in the attempt to solve the problems of the prior art.

In FIG. 5, reference numeral 7 denotes a reset circuit of $\phi 2$ an ATD clock signal. The ATD clock signal $\phi 2$ has the same waveform as the ATD clock signal $\phi 1$, but the application thereof is delayed relative to the ATD clock signal $\phi 1$, however, it is possible for the ATD clock signal $\phi 2$ to have the same waveform as the clock signal $\phi 1$, without a delay.

In the circuit of FIG. 5, when data is changed over, a reset circuit carries out a short-circuit between the output lines of the sense amplifiers 11 and 12.

Figure 6:
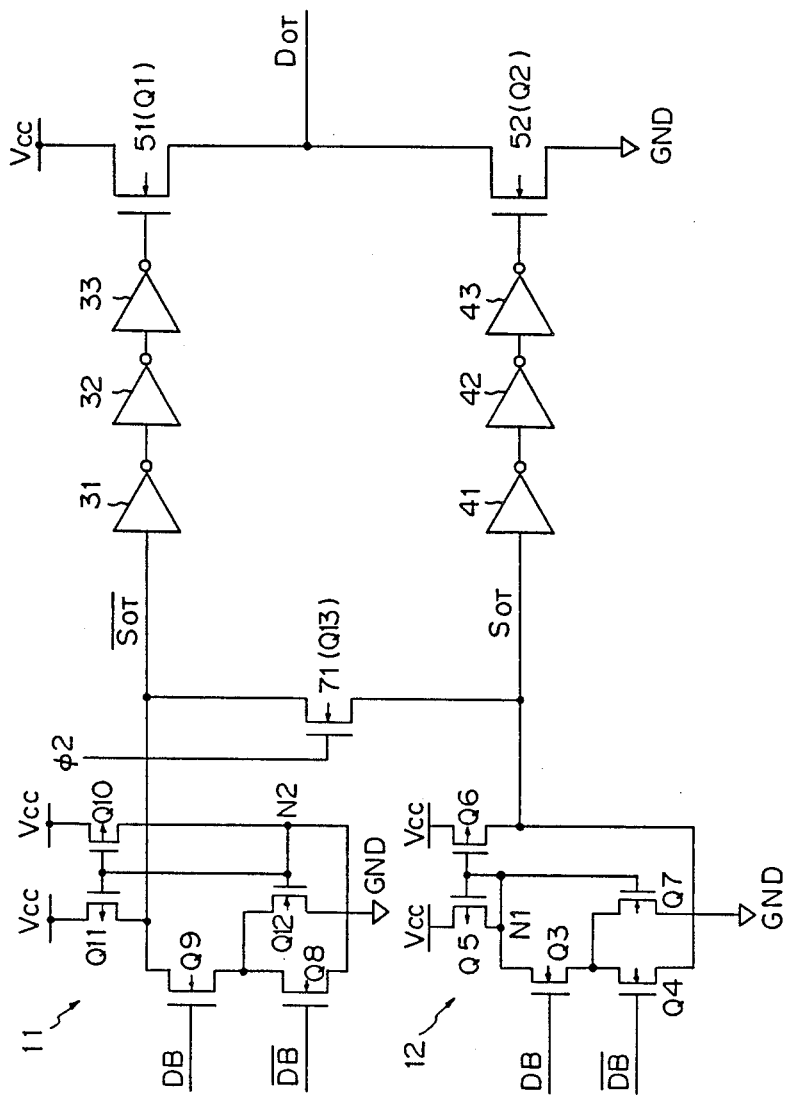

FIG. 6 is a block diagram of a circuit showing key points of the sense amplifiers 11 and 12. In FIG. 6, Q3 to Q13 denote transistors and N1, N2 nodes, respectively. A sense amplifier 11 is composed of transistors Q4 to Q12 and a sense amplifier 12 of transistors Q3 to Q7. A transistor Q13 is utilized to carry out a short-circuit between the output lines of the sense amplifiers 11 and 12 and is equivalent to the reset circuit 7 shown in FIG. 5.

In more detail, Q1, Q2, Q3, Q4, Q7, Q8, Q9, Q12, and Q13 denote each N-channel MOS transistor and Q5, Q6, Q10 and Q11 each P-channel MOS transistor, while sense amplifiers 11 and 12 are each current mirror type sense amplifier which is formed by a respective CMOS circuit.

The operation of sense amplifiers 11, 12 will be described hereunder.

The potential of a reference node N1 in a sense amplifier 12 is fed-back to the gates of the transistors Q3, Q5 and Q6. Therefore, the potential node N1 is stable at a potential when the current flowing through Q3 and that flowing through Q5 is the same.

Suppose that the potential of a data bus DB is higher than that of a data bus $\overline{DB}$. As the gate voltages of transistors Q5 and Q6 are the same, the conductance of transistor Q5 is the same as that of transistor Q6. Therefore, transistors Q6 and Q5 can supply the same value of current. The voltage of transistor Q4 between the gate and source is smaller than that of transistor Q3 between the gate and source and the conductance of transistor Q4 is smaller than that of transistor Q3, so the sense output $S_{OT}$ is a high level output.

The conductance of transistor Q8 in the sense amplifier 11 is smaller than that of transistor Q3 in the sense amplifier 12. As a result, the potential of the reference node N2 is lower than that of the reference node N1, while the current flowing through transistors Q10 and Q8 of the sense amplifier 11 is smaller than that flowing through transistors Q5 and Q3 of the sense amplifier 12. The conductance of transistors Q11 and Q10 is smaller than that of transistors Q5 and Q6. Moreover, as the conductance of transistor Q9 is larger than that of transistor Q8, the potential of the sense output $S_{OT}$ is smaller than that of the sense output $S_{OT}$ in the sense amplifier 12. When the potentials of the data buses DB and $\overline{DB}$ are inverted, the potentials of each points in the sense amplifiers 11 and 12 are also inverted.

Figure 7:
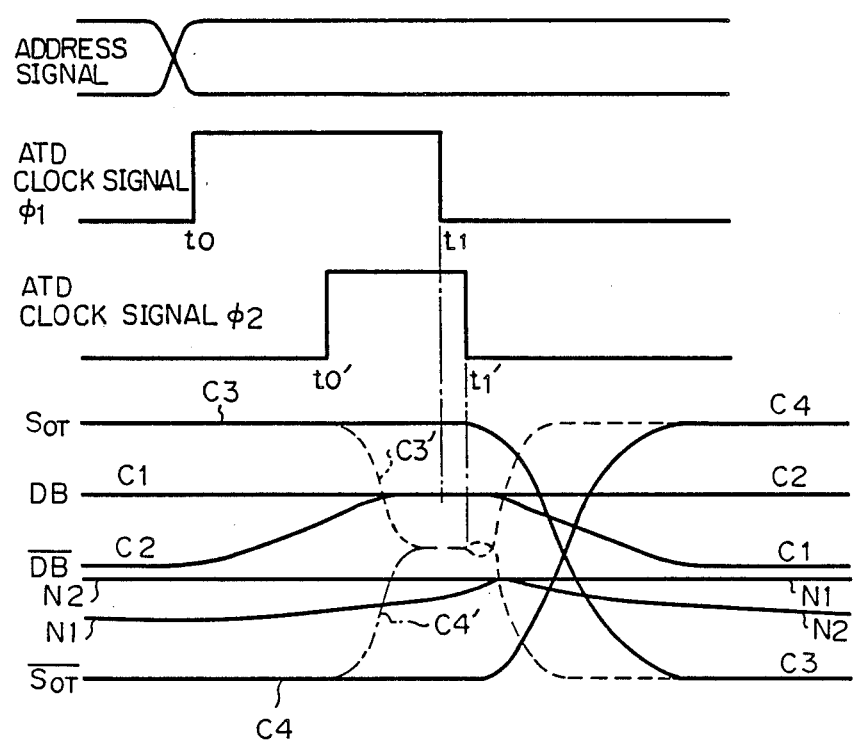
FIGS. 7 and 8 are timing charts for the device shown in FIG. 5.

FIG. 7 is a timing chart of signals at key points of the circuit, for explaining the operation of the circuit shown in FIG. 6.

In FIG. 7, C1, C2, C3, C4, C3', and C4' denote symbols for each curve. The operation of the sense amplifiers 11 and 12 as shown in FIG. 6 will be described with reference to FIG. 7.

First, suppose that a data bus line DB is at a HIGH level and a data bus line $\overline{DB}$ is at a LOW level.

Due to a read operation from the memory cell, if the data bus line DB is at a HIGH level and the data bus line $\overline{DB}$ is at a LOW level, a timing change of the potential on the data bus lines DB and $\overline{DB}$ is as seen in curves C1 and C2, and in this case, the sense outputs $S_{OT}$ and $S_{OT}$ of the sense amplifiers 11 and 12 are as seen in curves C3 and C4, and both curves show a considerable delay in time.

Nevertheless, if the transistor Q13 is made conductive by an ATD clock signal $\phi_2$, as shown in FIG. 6, and the sense outputs $S_{OT}$ and $S_{OT}$ of the two sense amplifiers 1A and 1B are reset, a high speed operation can be carried out. In this case, the curves C3 and C4 corresponding to the sense outputs $S_{OT}$ and $S_{OT}$ are as seen in curves C3' and C4' and the sense outputs $S_{OT}$ and $S_{OT}$ of the sense amplifiers 11 and 12 appear almost instantaneously. Further, these pair of sense amplifiers can be formed in a multi-stage structure to carry out a faster operation.

Problems remain, however, with regard to the data reading circuit, which is considered to be an intermediate circuit as shown in Fig.5 to FIG. 8.

This is because the change of the potentials at reference nodes N1 and N2, such that a HIGH level potential and a LOW level potential are produced at the outputs, is slow and inactive. That is, the transition from an old potential level to a new potential level is delayed at the reference nodes N1 and N2 and the old potential level remains.

As the nodes N1 and N2 have a respective parasitic capacity, the charges corresponding to the data which were read in the preceding read-cycle are stored therein. Namely, when the output potential of a sense amplifier changes from a present HIGH or LOW level to a subsequent potential level, a definite time is needed for the completion of the change. For example, when the output potential changes from a HIGH level to a LOW level, the former HIGH level remains, and when changing from a LOW level to a HIGH level, the former LOW level remains.

Accordingly, when the potential of the ATD clock falls, the target data is delivered as sense amplifier outputs $S_{OT}$ and $S_{OT}$ after the potentials of the sense amplifier outputs are used once or fall in opposite polarities. Thus, the speed of the operation is reduced accordingly.

Figure 8:
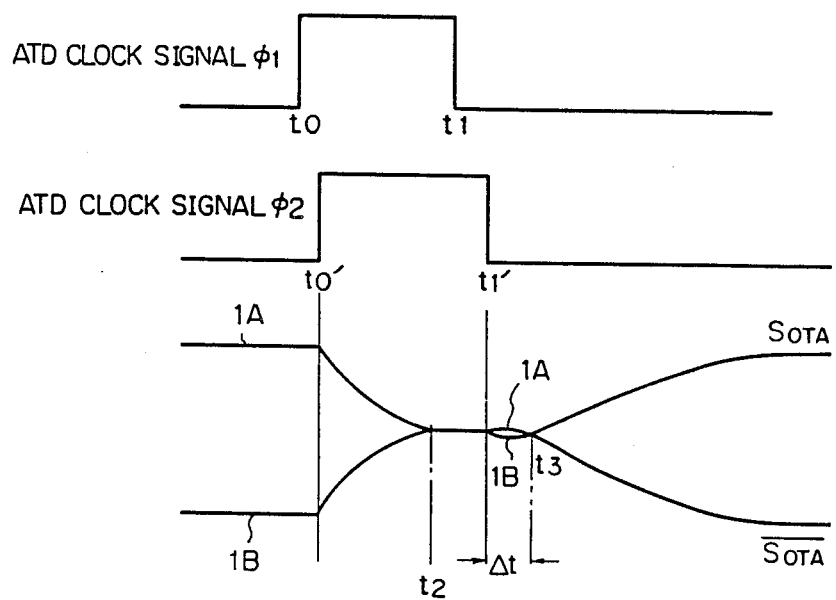

It can be understood from the waveform of the sense outputs $S_{OT}$ and $S_{OT}$ of the sense amplifiers 11 and 12 in a timing chart shown in FIG. 8 that such a phenomenon must appear.

Figure 9:
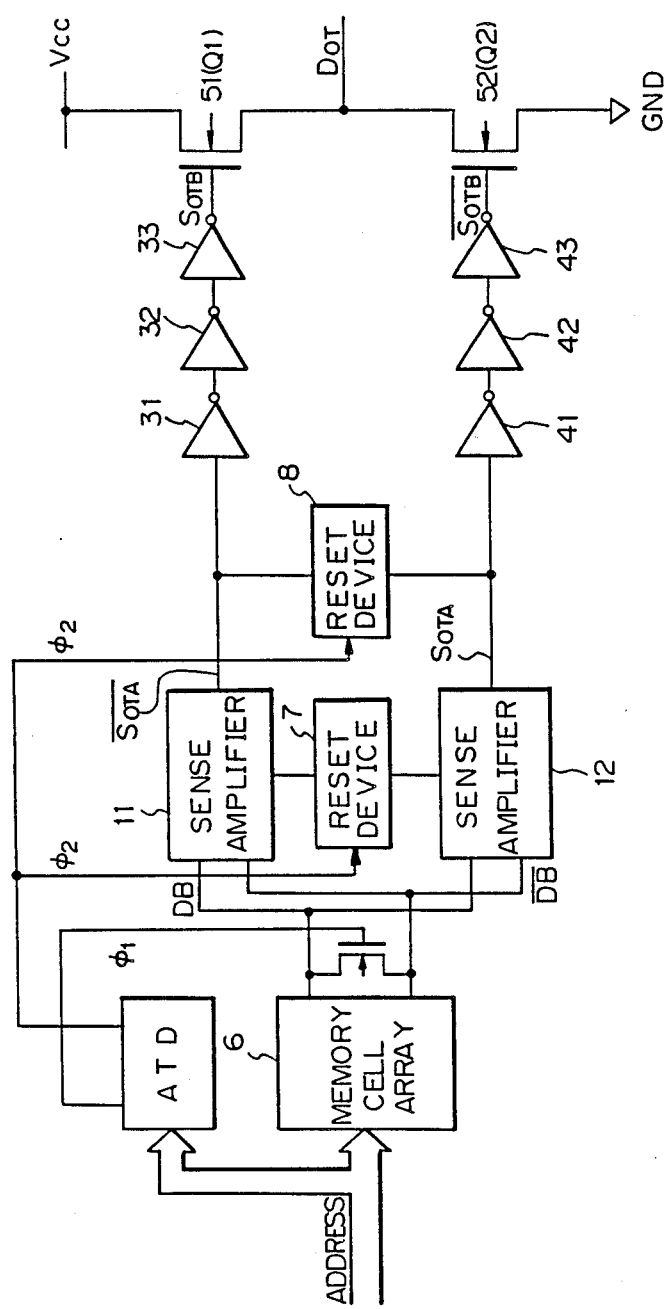
FIG. 9 is a circuit diagram showing an embodiment of the present invention.

In the device of FIG. 9 it is intended that the potential level will change rapidly at the reference nodes N1 and N2, and thus enhance the operation speed of the semiconductor memory.

Figure 10:
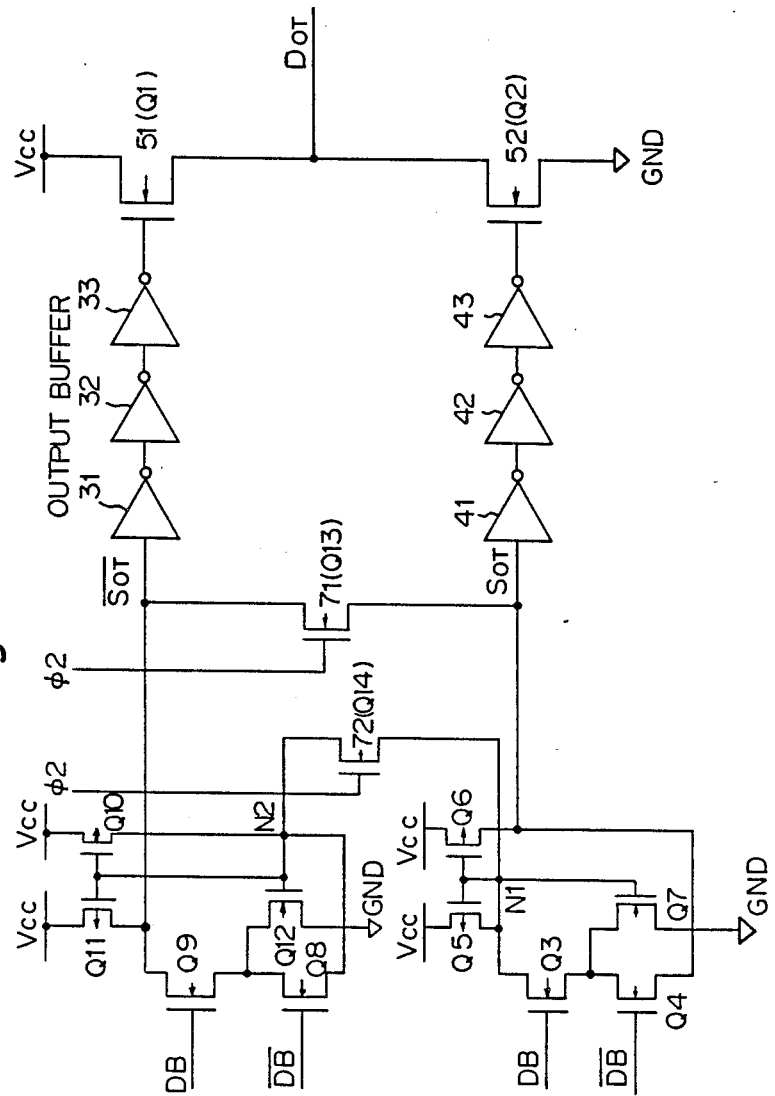
FIG. 10 is a detailed circuit diagram of the device shown in FIG. 9.
Figure 11:
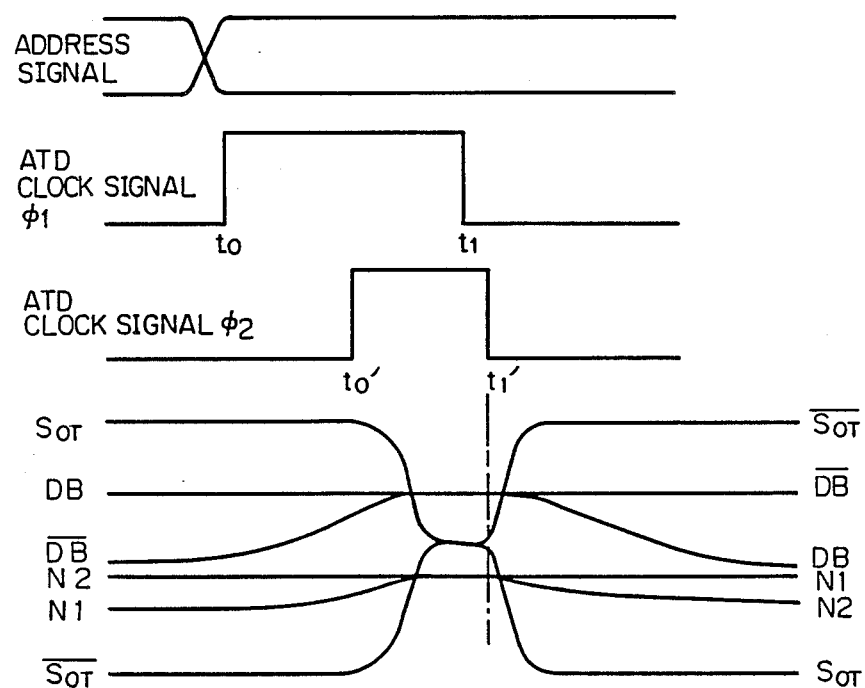
FIG. 11 is a timing chart showing the operation of the device shown in FIG. 9; and, FIGS. 12 and 13 are a circuit diagram and a timing chart of another embodiment of the present invention, respectively.

A data reading circuit for a semiconductor memory system, as an embodiment of the present invention, is illustrated in FIG. 9 and FIG. 10. FIG. 11 is a timing chart of signals of the device shown in FIG. 9.

In the circuit of FIG. 9, a reset circuit 7 is connected between reference nodes in the sense amplifiers 11 and 12.

FIG. 10 is a circuit diagram showing the sense amplifiers 11 and 12 and reset circuits 7 and 8 shown in the device of FIG. 9.

In FIG. 10, Q14 is a N channel MOS transistor for causing a short-circuit between the nodes N1 and N2, and is equivalent to the reset circuit 6 shown in FIG. 9.

In the circuits of FIG. 9 and FIG. 10, an ATD clock signal $\phi_2$ is applied to a transistor Q14 and conducted therethrough, to cause a short-circuit between the reference nodes N1 and N2, and thus an equipotential state at the reference nodes N1 and N2 is forcibly realized.

In this case, as described with reference to FIGS. 5 to 8, as intermediate devices to solve the problems in the prior art, a converse data state does not occur and a change can be made from an equipotential state to a new data state.

Also in this case, the waveforms of the sense outputs $S_{OT}$ and $S_{OT}$ in the sense amplifiers 11 and 12 are as seen from the timing chart as shown in FIG. 11. In the timing chart, it is apparent that a converse data state such as shown in FIG. 7 does not exist.

Figure 12:
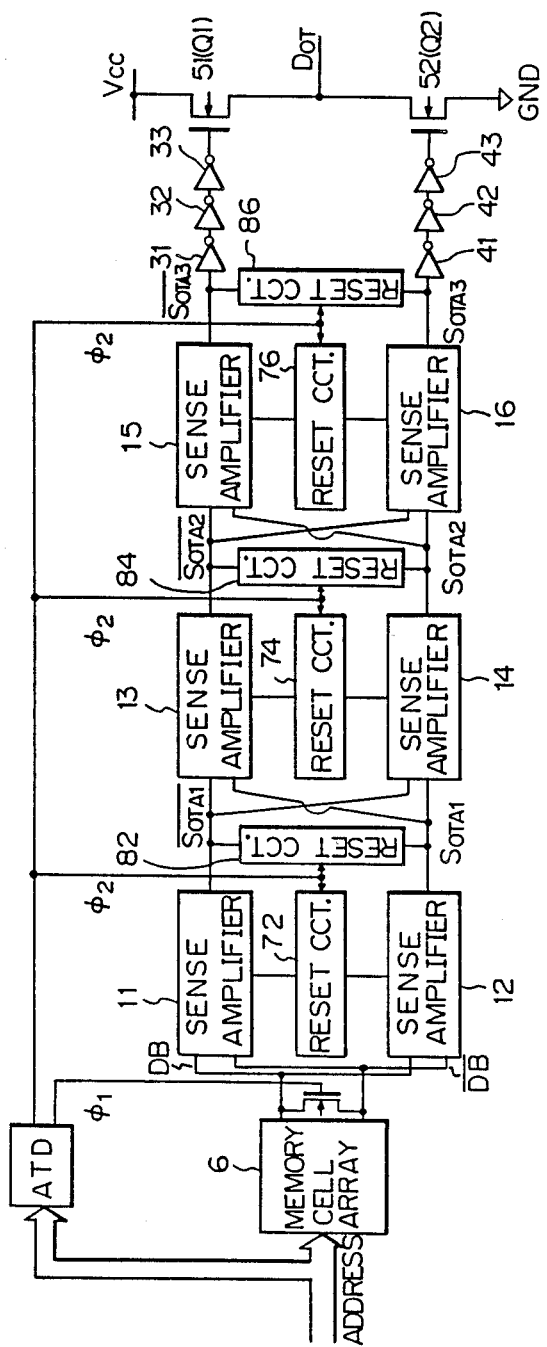
Figure 13:
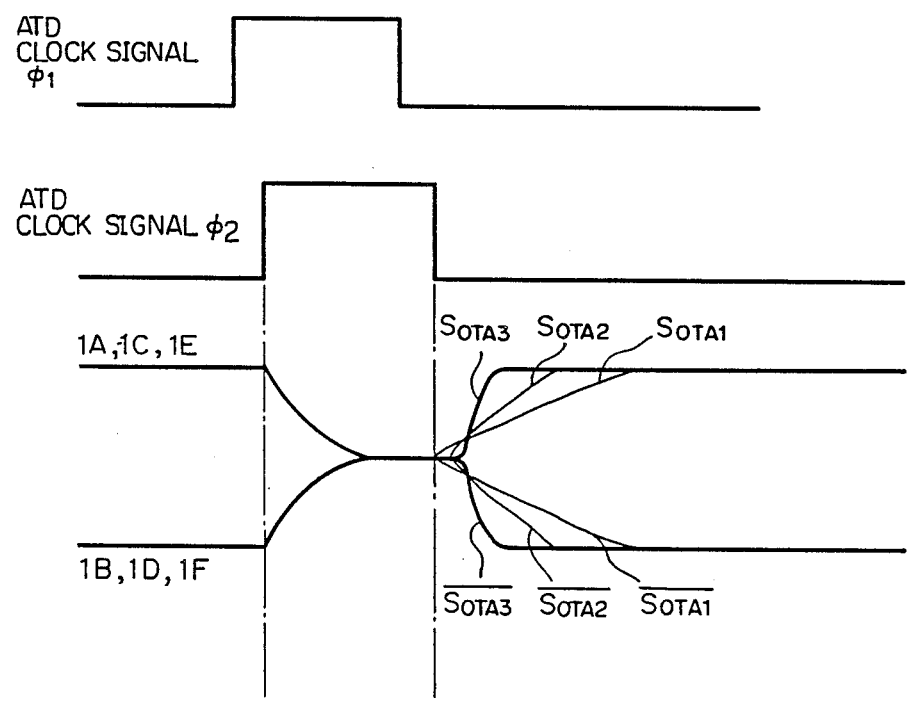

FIG. 12 is a circuit diagram showing an alternative embodiment of the present invention and FIG. 13 is a timing chart of the signals in the device shown in FIG. 12.

In FIG. 12, 13, 14, 15, and 16 denote the same sense amplifiers as the sense amplifiers 11 and 12, 82, 84 and 86 the same reset circuit as the reset circuit 8, and 72, 74 and 76, the same reset circuits as the reset circuit 7 shown in FIG. 9. In the device of FIG. 12, the sense amplifiers have a multi-stage structure.

In general, with respect to a sense amplifier, the timing the output potentials $S_{OTA}$ and $S_{OTA}$ necessary for a transfer to a target potential, i.e., a rise time or a fall time, is shorter in a two-stage structure than in a one stage structure, and shorter in a three-stage structure than in a two-stage structure. Thus, the larger the number of stages in the multi-stage structure, the more advantageously a faster operation can be carried out. FIG. 13 shows such a condition in more detail.

In the devices of FIGS. 9 and 10, the nodes which produce a HIGH level potential or a LOW level potential of the output in a sense amplifier are short-circuited and a reset operation is carried out. The phenomenon whereby the operation state of the circuit goes from a predetermined state through an intermediate reverse state to a desired state, as shown in FIG. 8, does not occur. Thus, when the potential of the ATD clock signal $\phi_2$ falls, a shift to a desired data state is commenced instantly, so that the operational speed of a semiconductor memory device is remarkably enhanced.

I claim:

1. A data reading circuit for a semiconductor memory device comprising:
   a first input terminal and a second input terminal each receiving complementary signals;

a first and a second current mirror type sense amplifiers, each of said current mirror type sense amplifiers including,
a reference node,
an output terminal,
a first transistor connected with said reference node, and
a second transistor connected with said output terminal, a gate of said first transistor of said first current mirror type sense amplifier and a gate of said second transistor of said second current mirror type sense amplifier being connected to said first input terminal, and a gate of said second transistor of said first current mirror type sense amplifier and a gate of said first transistor of said second current mirror type sense amplifier being connected to said second input terminal; and
a first short-circuiting transistor connected between the reference nodes of both said first and said second current mirror type sense amplifiers, said first short-circuiting transistor being able to conduct therethrough temporarily by receiving a clock signal at a gate.

2. A data reading circuit for a semiconductor memory device according to claim 1, wherein said data reading circuit further comprises a second short-circuiting transistor, said second short-circuiting transistor being connected between the output terminals of said first and said second current mirror type sense amplifiers and said second short-circuiting transistor is conducted therethrough temporarily by receiving said clock signal at said gate.

3. A data reading circuit for a semiconductor memory device according to claim 1, wherein said first current mirror type sense amplifier is composed of transistors Q3 to Q7, said second current mirror type sense amplifier is composed of transistors Q8 to Q12, a transistor Q13 can carry out a short-circuit operation between the output lines of said first sense amplifier and said second sense amplifier, and transistors Q3, Q4, Q7, Q8, Q9, Q12 and Q13 are N-channel MOS transistors, while transistors Q5, Q6, Q10 and Q11 P-channel MOS transistors and said first and second sense amplifiers are both current mirror type sense amplifiers which are formed by a respective CMOS circuit.

4. A data reading circuit for a semiconductor memory device according to claim 1, wherein said data reading circuit further comprises a third short-circuiting transistor and said third short-circuiting transistor is connected between said first and said second input terminals.

* * * * *